US008889023B2

(12) United States Patent
Matsumoto et al.

(10) Patent No.: US 8,889,023 B2
(45) Date of Patent: Nov. 18, 2014

(54) PLASMA PROCESSING APPARATUS AND PLASMA PROCESSING METHOD

(71) Applicant: Tokyo Electron Limited, Tokyo (JP)

(72) Inventors: Naoki Matsumoto, Miyagi (JP); Wataru Yoshikawa, Miyagi (JP); Yasuhiro Seo, Hiroshima (JP); Kazuyuki Kato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 61 days.

(21) Appl. No.: 13/728,551

(22) Filed: Dec. 27, 2012

(65) Prior Publication Data
US 2013/0115781 A1 May 9, 2013

Related U.S. Application Data

(63) Continuation-in-part of application No. PCT/JP2011/064311, filed on Jun. 22, 2011.

(30) Foreign Application Priority Data

Jun. 28, 2010 (JP) ................................. 2010-145866

(51) Int. Cl.
| | | |
|---|---|---|
| B44C 1/22 | (2006.01) | |
| C03C 1/00 | (2006.01) | |
| C03C 25/68 | (2006.01) | |
| C23F 1/00 | (2006.01) | |
| H01J 37/32 | (2006.01) | |
| H01L 21/3065 | (2006.01) | |
| H01L 21/3213 | (2006.01) | |

(52) U.S. Cl.
CPC ....... *H01L 21/3065* (2013.01); *H01J 37/32449* (2013.01); *H01J 37/32192* (2013.01); *H01L 21/32136* (2013.01)
USPC ............................................ 216/69; 438/726

(58) Field of Classification Search
CPC ................ H01J 37/3244; H01J 37/321; H01J 37/32082; H01J 37/32449; H01L 21/3116
USPC ............................................ 216/69; 438/726
See application file for complete search history.

(56) References Cited

U.S. PATENT DOCUMENTS

| 2007/0151668 A1* | 7/2007 | Mizusawa ................ 156/345.29 |
| 2007/0215580 A1 | 9/2007 | Koshiishi et al. |
| 2008/0078746 A1 | 4/2008 | Masuda |
| 2011/0266257 A1 | 11/2011 | Nishizuka et al. |

FOREIGN PATENT DOCUMENTS

| JP | 2007-184329 A | 7/2007 |
| JP | 2007-250838 A | 9/2007 |
| JP | 2008-47687 A | 2/2008 |
| JP | 2010-118549 A | 5/2010 |
| TW | 200839924 A | 10/2008 |

OTHER PUBLICATIONS

International Search Report mailed Sep. 13, 2011 in PCT/JP2011/064311 filed Jun. 22, 2011.

\* cited by examiner

*Primary Examiner* — Roberts Culbert
(74) *Attorney, Agent, or Firm* — Rothwell, Figg, Ernst & Manbeck, P.C.

(57) ABSTRACT

A plasma processing apparatus includes a flow splitter for dividing a common gas into two common gas streams of common gas branch lines. A central introduction portion connected to one of the common gas branch lines supplies a common gas to a central portion of a substrate to be processed. A peripheral introducing portion connected to the other one of the common gas branch lines supplies the common gas to a peripheral portion of the substrate. The peripheral introducing portion has peripheral inlets arranged about a circumferential region above the substrate. An additive gas line is connected to an additive gas source to add an additive gas to at least one of the common gas branch lines. In addition, an electron temperature of a plasma in a region where the peripheral inlets are disposed is lower than that in a region where the introduction portion is disposed.

2 Claims, 8 Drawing Sheets

X-X CROSS SECTION

COMPARATIVE EXAMPLE 1

TEST EXAMPLE 1 (ADDING HBr + $O_2$ TO EDGE)

PLASMA PROCESSING APPARATUS AND PLASMA PROCESSING METHOD

This application is a Continuation-In-Part application of PCT International Application No. PCT/JP2011/064311 filed on Jun. 22, 2011, which designated the United States. The PCT '311 application further claims priority to Japanese Application No. 2010-145866, filed on Jun. 28, 2010, the entire contents of which are incorporated herewith.

FIELD OF THE INVENTION

The present invention relates to a plasma processing apparatus and method which performs plasma processing on a substrate by using a plasma generated from a processing gas introduced into a processing chamber.

BACKGROUND OF THE INVENTION

Conventionally, in the field of semiconductor device fabrication, plasma processes are widely used. Plasma processing includes, for example, plasma etching and plasma chemical vapor deposition (CVD). Plasma etching is used to form a fine pattern of the semiconductor device and is an important basic technology together with lithography. In large scale integration (LSI) devices, the variations in the film or types of films as well as finer pattern requirements, have placed increasing demands upon microfabrication performance and uniform control technology, particularly for a large diameter wafer of, e.g., 300 mm or more in the plasma etching.

Conventionally, parallel plate, electron cyclotron resonance (ECR), inductive coupled plasma (ICP) and the like have been developed as plasma sources for plasma etching. For example, Japanese Patent Laid-open Publication No. 2008-47687 discloses a plasma etching apparatus using a parallel plate as a plasma source. In this parallel plate type plasma etching apparatus, a pair of an upper electrode and a lower electrode parallel to each other is disposed in a processing chamber. While a high frequency power is applied to the lower electrode, etching is performed on a substrate mounted on the lower electrode.

In order to improve the uniformity in the surface of the substrate to be etched, the upper electrode is divided into a central portion for supplying a processing gas to the center of the substrate, and a peripheral portion for supplying a processing gas to the periphery of the substrate. Then, a common processing gas is supplied to the substrate from the central portion and the peripheral portion of the upper electrode, and an additive gas is added to the common gas in the peripheral portion. By adding the additive gas, it is possible to improve the in-surface non-uniformity of etching caused by the fact that the central portion of the substrate is hardly exhausted compared to the peripheral portion.

In recent years, there has been developed a plasma etching apparatus using a radial line slot antenna as a plasma source (see, e.g., Japanese Patent Laid-open Publication No. 2010-118549). In the plasma etching apparatus using the radial line slot antenna, a slot antenna having a plurality of slots is installed on a dielectric window of a processing chamber. A microwave emitted from the slots of the slot antenna is introduced into a processing space of the processing chamber through the dielectric window made of a dielectric material. The processing gas is converted into a plasma by the energy of the microwave.

The microwave plasma generated by the radial line slot antenna is characterized in that a plasma having a relatively high electron temperature of several eV is generated immediately below the dielectric window (referred to as plasma excitation region), and diffuses and becomes a plasma having a low electron temperature of about 1 to 2 eV immediately above the substrate located at a position lower at least 100 mm than the dielectric window (referred to as plasma diffusion region). That is, it is characterized in that the change in the electron temperature of the plasma occurs as a function of distance from the dielectric window.

In the radial line slot antenna type plasma etching apparatus, the etching gas is supplied to the low electron temperature region, and a dissociation control of the etching gas (control of the generation amount of etching species in the plasma) is performed, thereby controlling the etching reaction (chemical reaction of the substrate surface by etching species). Accordingly, high precision of etching is promoted and damage to the substrate is greatly reduced. For example, it is possible to suppress the damage, such as a recess to the substrate, while manufacturing a device according to design dimensions in etching or the like in the step of forming a spacer.

In recent years, with variations in the films and the use of various types of films, or the improvement of the microfabrication performance of semiconductor devices, both various dissociation controls of the etching gas and control of in-surface uniformity of the substrate are needed.

However, in the parallel plate type plasma etching apparatus described in Japanese Patent Laid-open Publication No. 2008-47687, a plasma generated between upper and lower electrodes that are separated by a short distance of 40 mm or less is used, and the electron temperature of the plasma is kept high until it reaches the lower electrode from the upper electrode. Further, both the common gas and the additive gas are introduced into the upper electrode. Accordingly, there is a problem in that the dissociation of the common gas and the additive gas cannot be controlled in various levels.

In the etching apparatus using the radial line slot antenna disclosed in Japanese Patent Laid-open Publication No. 2010-118549, it is difficult to make constant the etching shape or the etching rate in the surface of the substrate, and it has become a challenge to uniformly perform the etching process in the surface of the substrate.

In view of the above, the present invention provides a plasma processing apparatus and method capable of controlling the dissociation state of a processing gas in various levels and also controlling the in-surface uniformity of the substrate processing.

SUMMARY OF THE INVENTION

In accordance with an aspect of the invention, there is provided a plasma processing apparatus including a processing chamber which has a dielectric window provided at a ceiling portion thereof, and whose inside can be maintained airtightly. The dielectric window transmits a microwave therethrough. A mounting table is provided inside the processing chamber to mount a substrate thereon; and a slot antenna is provided on an upper surface of the dielectric window of the processing chamber, and introduces a microwave into a processing space of the processing chamber through slots. A microwave generator generates a microwave of a predetermined frequency, and a microwave introduction path guides the microwave generated by the microwave generator to the slot antenna. In addition, a processing gas introduction unit introduces a processing gas supplied from a processing gas source into the processing chamber, and an exhaust unit exhausts the processing gas introduced into the processing chamber, through an exhaust port provided below an upper surface of the substrate mounted on the mounting table.

The processing gas source includes a common gas source for supplying a common gas, and an additive gas source for supplying an additive gas. The processing gas introduction unit includes a common gas line connected to the common gas source, and a flow splitter is provided in the common gas line to divide the common gas into two common gas streams flowing through two common gas branch lines, and can adjust a ratio of flow rates of the two common gas streams in the common gas branch lines. A central introduction portion is connected to one of the common gas branch lines and has a central inlet to supply the common gas to a central portion of the substrate mounted on the mounting table. In addition, a peripheral introducing portion is connected to the other one of the common gas branch lines and has peripheral inlets arranged in a circumferential direction (about a circumferential region) above the substrate to supply the common gas to a peripheral portion of the substrate mounted on the mounting table. An additive gas line is connected to the additive gas source to add the additive gas to at least one of the common gas branch lines, and a flow control unit is provided in the additive gas line to adjust a flow rate of the additive gas. Further, the central inlet is disposed at a central portion of the dielectric window of the processing chamber, the peripheral inlets are disposed above the substrate mounted on the mounting table and below the dielectric window of the processing chamber, and an electron temperature of a plasma in a region where the peripheral inlets are disposed is lower than that in a region where the central inlet is disposed.

In accordance with another aspect of the present invention, there is provided a plasma processing method which includes introducing a processing gas into a processing chamber which has a dielectric window provided at a ceiling portion of the processing chamber. The dielectric window transmits therethrough a microwave for generating a plasma, and an inside of the processing chamber is capable of being maintained airtightly. Processing gas introduced into the processing chamber is exhausted through an exhaust port provided below an upper surface of a substrate mounted on a mounting table; and a plasma is introduced into a processing space of the processing chamber through slots of a slot antenna provided on an upper surface of the dielectric window of the processing chamber. The method further includes dividing a common gas supplied from a common gas source into two common gas streams by a flow splitter, and introducing the common gas divided into two common gas streams to a central introduction portion having a central inlet which supplies the common gas to a central portion of the substrate mounted on the mounting table, and to a peripheral introduction portion having peripheral inlets which supply the common gas to a peripheral portion of the substrate mounted on the mounting table. The peripheral inlets are arranged in a circumferential direction (about a circumferential region) above the substrate. In addition, an additive gas is supplied from an additive gas source to at least one of the two common gas streams. Further, the central inlet is disposed at a central portion of the dielectric window of the processing chamber, the peripheral inlets are disposed above the substrate mounted on the mounting table and below the dielectric window of the processing chamber, and an electron temperature of a plasma in a region where the peripheral inlets are disposed is lower than that in a region where the central inlet is disposed.

DETAILED DESCRIPTION OF THE EMBODIMENTS

Structure of Plasma Processing Apparatus

Figure 1:
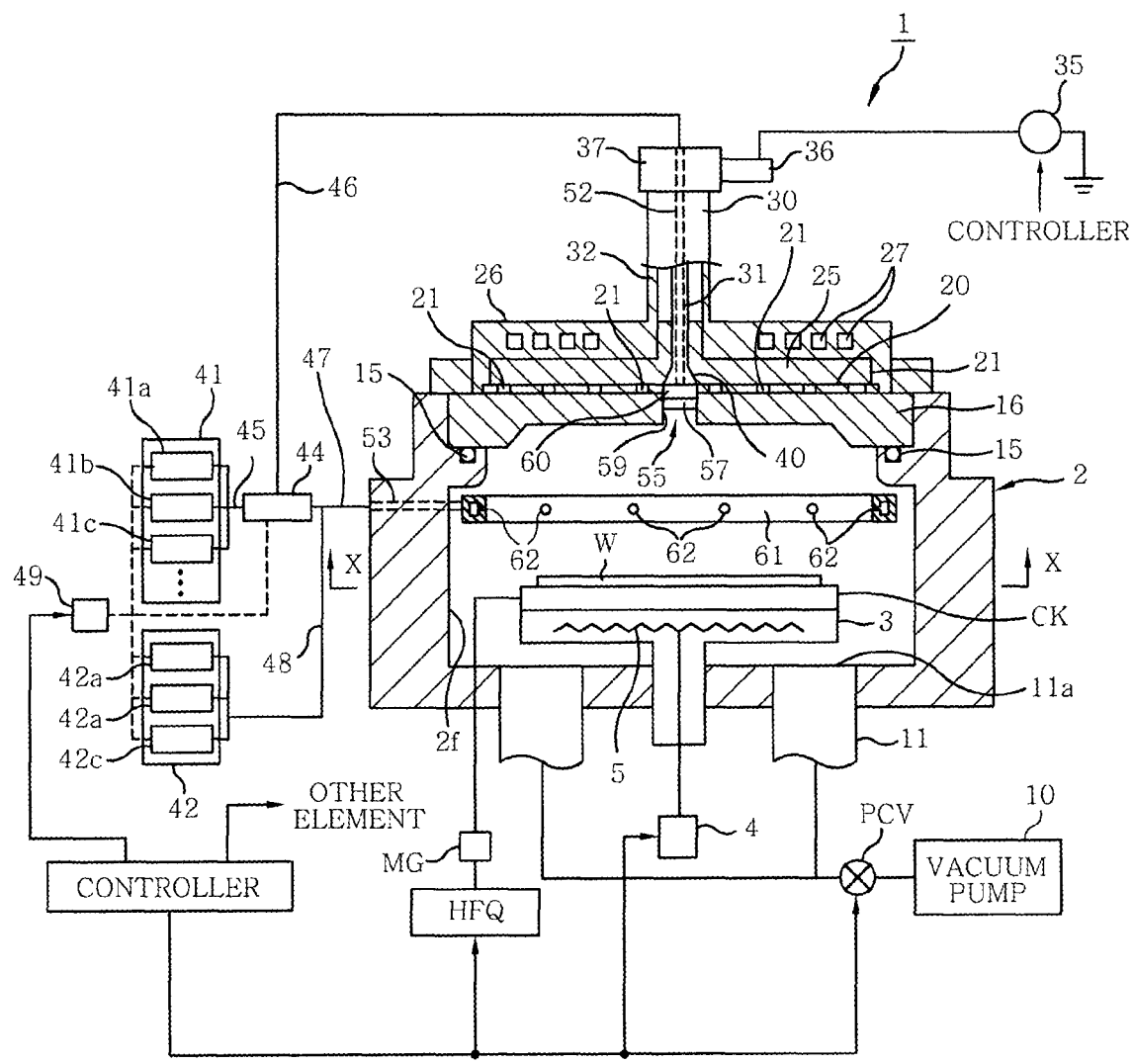
FIG. 1 is a vertical cross-sectional view of a plasma processing apparatus in accordance with an embodiment of the present invention.

Hereinafter, an example of an embodiment of the present invention will be described in detail with reference to the accompanying drawings. The same reference numerals are assigned to substantially the same constituent elements in this specification and the drawings.

As shown in FIG. 1, a plasma processing apparatus 1 includes a cylindrical processing chamber 2. A ceiling portion of the processing chamber 2 is closed by a dielectric window (top panel) 16 made of a dielectric material. The processing chamber 2 is made of, e.g., aluminum, and is electrically grounded. The inner wall surface of the processing chamber 2 is covered with an insulating protective film 2f made of, e.g., alumina.

A mounting table 3 for mounting a semiconductor wafer (hereinafter referred to as "wafer") W serving as a substrate is provided at the center of a bottom portion of the processing chamber 2. The wafer W is held on an upper surface of the mounting table 3. The mounting table 3 is made of a ceramic material such as alumina and alumina nitride. A heater 5 is embedded in the mounting table 3 such that the wafer W can be heated to a predetermined temperature. The heater 5 is connected to a heater power source 4 through a wiring disposed in a pillar.

An electrostatic chuck CK is provided on the upper surface of the mounting table 3 to electrostatically adsorb the wafer W placed on the mounting table 3. A bias high frequency power supply HFQ for applying a bias high frequency power via a matching unit MG is connected to the electrostatic chuck CK.

Exhaust pipes 11 for exhausting a processing gas from exhaust ports 11a disposed below the surface of the wafer W placed on the mounting table 3 are provided at the bottom portion of the processing chamber 2. A pressure control valve PCV and a vacuum pump 10 are connected to the exhaust pipes 11. The pressure in the processing chamber 2 is adjusted to a predetermined pressure by a pressure control valve PCV and a vacuum pump 10. The exhaust pipes 11, the pressure control valve PCV and the vacuum pump (exhaust device) 10 constitute an exhaust means. That is, the exhaust device 10 communicates with the inside of the processing chamber 2 through the pressure control valve PCV.

A dielectric window 16 is provided at the ceiling portion of the processing chamber 2 with a seal 15 such as an O-ring therebetween to ensure airtightness. The dielectric window 16 is made of a dielectric material such as quartz, alumina ($Al_2O_3$), and aluminum nitride (AlN), and is transparent to the microwave.

A disc-shaped slot antenna 20 is provided on an upper surface of the dielectric window 16. The slot antenna 20 is made of a conductive material, e.g., copper plated or coated with Ag, Au or the like. For example, a plurality of T-shaped slots 21 are arranged concentrically on the slot antenna 20.

A dielectric plate 25 for compressing the wavelength of the microwave is disposed on an upper surface of the slot antenna 20. The dielectric plate 25 is made of, e.g., quartz ($SiO_2$), alumina ($Al_2O_2$), and aluminum nitride (AlN). The dielectric plate 25 is covered with a conductive cover 26. An annular heat medium flow passage 27 is provided in the cover 26. The cover 26 and the dielectric plate 25 are adjusted to a predetermined temperature by a heat transfer medium flowing through the heat medium flow passage 27. For example, in the case of the microwave having a frequency of 2.45 GHz, wavelength thereof in vacuum is about 12 cm, and the wavelength in the dielectric window 16 made of alumina is about 3 to 4 cm.

A coaxial waveguide 30 propagating the microwave is connected to the center of the cover 26. The coaxial waveguide 30 includes an inner conductor 31 and an outer conductor 32. The inner conductor 31 is connected to the center of the slot antenna 20 through the center of the dielectric plate 25.

A microwave generator 35 is connected to the coaxial waveguide 30 through a mode converter 37 and a rectangular waveguide 36. The microwave having a frequency of 860 MHz, 915 MHz, 8.35 GHz or the like other than 2.45 GHz may be used.

The microwave generated by the microwave generator 35 propagates in the rectangular waveguide 36, the mode converter 37 and the coaxial waveguide 30 serving as a microwave introduction path, and the dielectric plate 25. The microwave propagated to the dielectric plate 25 is supplied into the processing chamber 2 from the slots 21 of the slot antenna 20 through the dielectric window 16. An electric field is formed below the dielectric window 16 by the microwave, and a processing gas in the processing chamber 2 is converted into a plasma.

A lower end of the inner conductor 31 connected to the slot antenna 20 is formed in a truncated cone shape. Accordingly, the microwave can be propagated efficiently without loss into the dielectric plate 25 and the slot antenna 20 from the coaxial waveguide 30.

The microwave plasma generated by a radial line slot antenna is characterized in that a plasma having a relatively high electron temperature of several eV generated immediately below the dielectric window 16 (referred to as plasma excitation region) diffuses and becomes a plasma having a low electron temperature of about 1 to 2 eV immediately above the wafer W (plasma diffusion region). That is, unlike the plasma generated by a parallel plate type plasma source or the like, it is characterized in that the distribution of the electron temperature of the plasma is definitely generated as a function of distance from the dielectric window 16.

Figure 3:
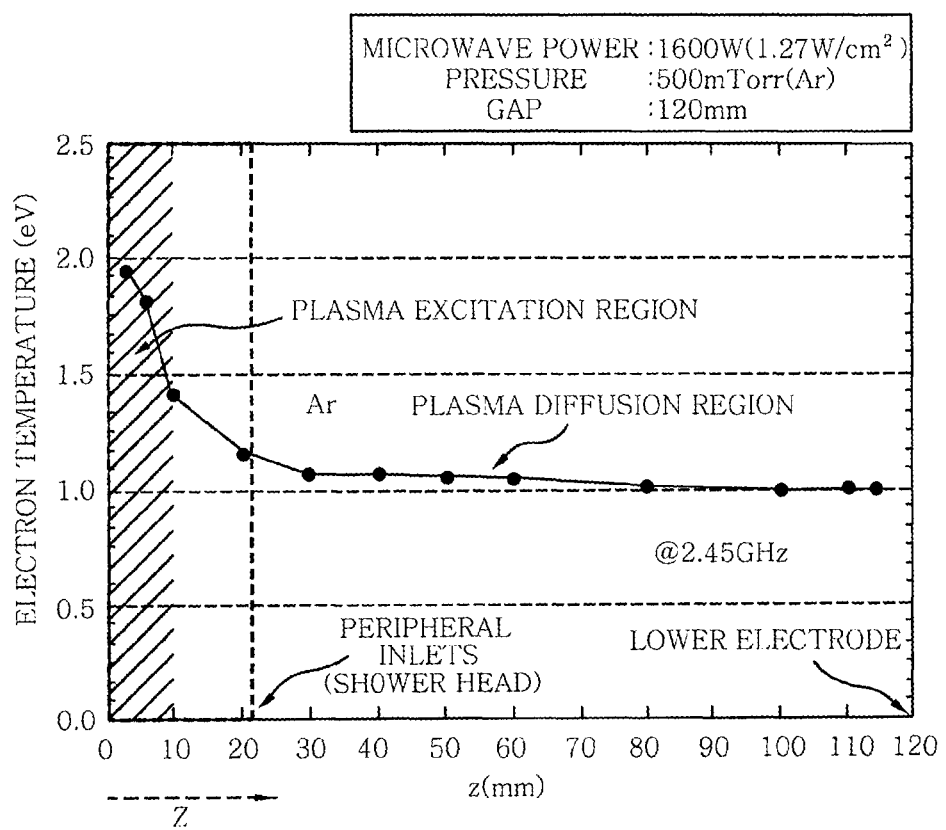
FIG. 3 is a graph showing a relationship between the distance Z from the dielectric window and the electron temperature of the plasma.

More specifically, as shown in FIG. 3, as a function of distance Z from immediately below the dielectric window 16, the electron temperature of several eV to about 10 eV immediately below the dielectric window 16 is attenuated to about 1 to 2 eV on the wafer W. Since the processing of the wafer W is performed in the region (plasma diffusion region) where the electron temperature of the plasma is low, there is no significant damage such as a recess to the wafer W. When the processing gas is supplied to the region (plasma excitation region) where the electron temperature of the plasma is high, the processing gas is easily excited to be dissociated. On the other hand, when the processing gas is supplied to the region (plasma diffusion region) where the electron temperature of the plasma is low, the degree of dissociation is suppressed compared with the case where the processing gas is supplied to the vicinity of the plasma excitation region.

A central introduction portion 55 for introducing a processing gas to the center of the wafer W is provided at the center of the dielectric window 16 in the ceiling portion of the processing chamber 2. A supply passage 52 of a processing gas is formed in the inner conductor 31 of the coaxial waveguide 30. The central introduction portion 55 is connected to the supply passage 52.

Figure 2:
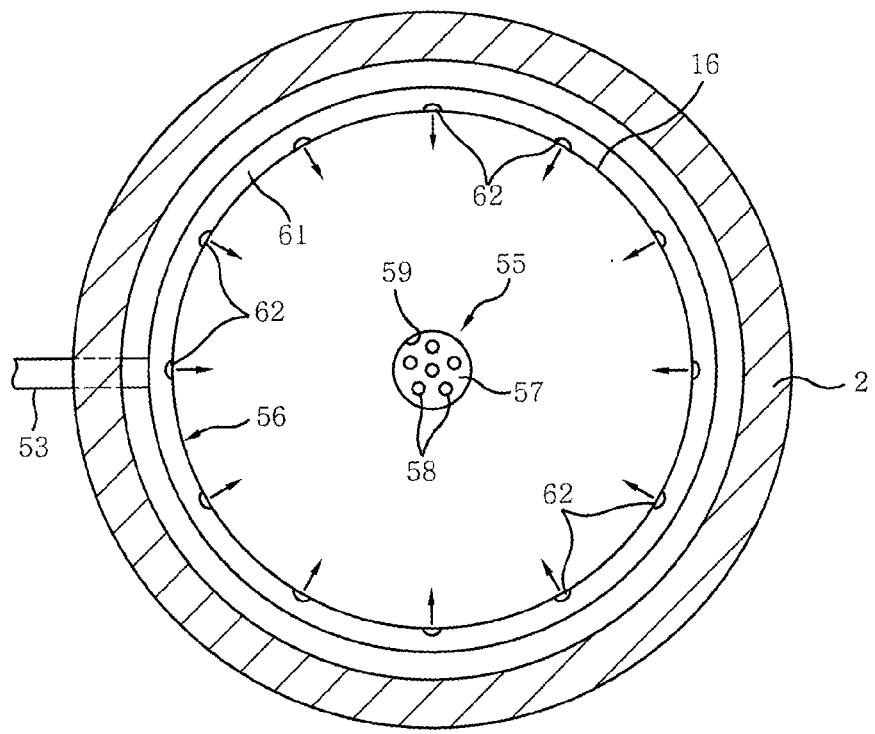
FIG. 2 is a cross-sectional view taken along line X-X of FIG. 1.

The central introduction portion 55 includes a block having a cylindrical shape which is inserted into a cylindrical space 59 provided at the center of the dielectric window 16, and a gas reservoir portion 60 which is formed to have an appropriate interval between a lower surface of the inner conductor 31 of the coaxial waveguide 30 and an upper surface of the block 57. The block 57 is made of, e.g., a conductive material such as aluminum, and is electrically grounded. A plurality of central inlets 58 (see FIG. 2) are formed in the block 57 to pass through the block 57 in the vertical direction. The central inlets 58 are formed to have a perfect circle or oval shape in a plan view considering a necessary conductance and the like. The block 57 made of aluminum is coated with an anodic oxidized alumina ($Al_2O_3$), yttrium oxide ($Y_2O_3$) or the like.

The processing gas supplied to the gas reservoir portion 60 from the supply passage 52 passing through the inner conductor 31 diffuses in the gas reservoir portion 60, and then is injected toward the center of the wafer W downward from the central inlets 58 of the block 57.

In the processing chamber 2, a ring-shaped peripheral introduction portion 61 for supplying a processing gas to a peripheral portion of the wafer W is placed so as to surround the periphery above the wafer W. The peripheral introduction portion 61 is disposed above the wafer W placed on the mounting table and below the central inlets 58 disposed at the ceiling. The peripheral introduction portion 61 is an annular hollow pipe, and a plurality of peripheral inlets 62 are spaced at predetermined intervals in the circumferential direction at the inner peripheral side thereof. The peripheral inlets 62 are configured to inject a processing gas toward the center of the peripheral introduction portion 61. The peripheral introduction portion 61 is made of, e.g., quartz.

A supply passage 53 made of stainless steel is formed to pass through the side surface of the processing chamber 2. The supply passage 53 is connected to the peripheral introduction portion 61. After diffusing into the space in the peripheral introduction portion 61, the processing gas supplied into the peripheral introduction portion 61 from the supply passage 53 is injected toward the inside of the peripheral introduction portion 61 from the peripheral inlets 62. The processing gas injected from the peripheral inlets 62 is supplied to the top periphery of the wafer W. Further, instead of providing the ring-shaped peripheral introduction portion 61, the peripheral inlets 62 may be formed at the inner surface of the processing chamber 2.

A processing gas source for supplying a processing gas into the processing chamber 2 includes a common gas source 41 and an additive gas source 42. The common gas source 41 and the additive gas source 42 supply a processing gas according to a plasma etching process or plasma CVD process. For example, when etching a silicon-based film such as a poly-Si film, an Ar gas, HBr gas (or $Cl_2$ gas) and $O_2$ gas are supplied. When etching an oxide film such as a $SiO_2$ film, an Ar gas, CHF-based gas, CF-based gas and $O_2$ gas are supplied. When etching a nitride film such as a SiN film, an Ar gas, CF-based gas, CHF-based gas and $O_2$ gas are supplied.

Further, the CHF-based gas may include $CH_2(CH_2)_2CH_2F$, $CH_2(CH_2)_4CH_2F$, $CH_2(CH_2)_7CH_2F$, $CHCH_2F_2$, $CHF_2$, $CH_2F$, $CH_2F_2$ or the like.

The CF-based gas may include $C(CF_3)_4$, $C(C_2F_5)_4$, $C_4F_8$, $C_2F_2$, $C_5F_8$ or the like.

The same type of gases may be supplied from the common gas source 41 and the additive gas source 42. Different types of gases may be supplied from the common gas source 41 and the additive gas source 42. As will be described later, in order to suppress the dissociation of etching gas, a plasma excitation gas may be supplied from the common gas source 41, and an etching gas may be supplied from the additive gas source 42. For example, when etching a silicon-based film, only the Ar gas is supplied as a plasma excitation gas from the common gas source 41, and only the HBr gas and $O_2$ gas are supplied from the additive gas source 42.

In addition, the common gas source 41 supplies a cleaning gas such as $O_2$ and $SF_6$, and other common gases. The common gas supplied by the common gas source 41 is divided into two streams by a flow splitter 44 which will be described later. By providing the common gas source 41, it is not necessary to provide a common gas source in the additive gas source 42, and it is possible to simplify the gas lines.

Flow control valves 41a, 41b and 41c, each controlling the flow rate of each gas, are provided in the common gas source 41. Further, a control device 49 for controlling the flow rate is connected to the flow control valves 41a, 41b and 41c, the flow splitter 44 and flow control valves 42a, 42b and 42c. The flow control valves 41a, 41b and 41c are connected to a plurality of common gas lines 45. In order to mix the gases, the common gas lines 45 are combined into a single line to be connected to the upstream side of the flow splitter 44. The flow control valves 41a, 41b and 41c are controlled by the control device 49. The control device 49 adjusts the flow rate of each gas and determines the flow rate and partial pressure for each of gas species of the common gas supplied to the flow splitter 44.

After being mixed, the common gas supplied from the common gas source is introduced into the flow splitter 44 provided in the common gas line. The flow splitter 44 divides the common gas into two streams. At the downstream side of the flow splitter 44, two common gas branch lines 46 and 47 are provided. One line 46 of the two common gas branch lines is connected to the central inlets 58 of the ceiling portion of the processing chamber 2, and the other line 47 is connected to the peripheral introduction portion 61 in the processing chamber 2.

The flow splitter 44 adjusts a branching ratio of the common gas divided into two systems, i.e., a ratio of the flow rate of the common gas branch line 46 to the flow rate of the common gas branch line 47. The flow splitter 44 is controlled by the control device 49, and the control device 49 determines the branching ratio of the common gas.

In this case, for the purpose of generation of a uniform plasma and uniform in-surface processing of the wafer W, a technology for adjusting a branching ratio of the common gas by the flow splitter 44 and adjusting the gas introduction amount from the central inlets 58 and the peripheral introduction portion 61 is referred to as radial distribution control (RDC). The RDC is represented by a ratio of the gas introduction amount from the central inlets to the gas introduction amount from the peripheral introduction portion 61. In general RDC, common gas species are introduced into the central introduction portion 55 and the peripheral introduction portion 61. The optimum RDC value is determined experimentally according to a variety of conditions and types of films to be etched.

In the etching process, byproducts (deposits and residues) are produced during the etching. Therefore, in order to improve the gas flow in the processing chamber 2, and to facilitate the discharge of the byproducts to the outside of the processing chamber, it is being considered to alternately perform the gas introduction from the central introduction portion 55 and the gas introduction from the peripheral introduction portion 61. This can be achieved by temporally switching the RDC. For example, the byproducts are swept from the processing chamber 2 by repeating the step of introducing a large amount of gas to the central portion of the wafer W, and the step of introducing a large amount of gas to the peripheral portion of the wafer W at a predetermined cycle while adjusting the air flow, thereby achieving a more uniform etching rate.

The flow control valves 42a, 42b and 42c, each controlling the flow rate of each gas, are provided in the additive gas source 42. The flow control valves 42a, 42b and 42c are connected to a plurality of additive gas lines 48. In order to mix the gases, the additive gas lines 48 are combined into a single line. Further, the additive gas line 48 is connected to the common gas branch line 47 at the downstream side of the flow splitter 44. The control device 49 controls the flow rate of each gas of the additive gas source 42, and controls the partial pressure of each of gas species of the additive gas added to the common gas branch line 47.

Further, in this embodiment, the additive gas line is connected to the common gas branch line 47 connected to the peripheral introduction portion 61. However, alternatively, the additive gas line may be connected to the common gas branch line 46.

According to the plasma processing apparatus 1 of this embodiment, since the additive gas line is connected to the common gas branch line 47 which is one of two streams divided by the flow splitter 44, and the additive gas is added to the common gas branch line 47, it is possible to arbitrarily vary the partial pressure of each of gas species or gas species itself between the common gas branch lines 46 and 47 of two streams. Since the partial pressure of each of gas species of the introduced processing gas or gas species itself can be changed at the central portion and the peripheral portion of the wafer W, it is possible to variously change the characteristics of the plasma processing.

Example of Etching Using the Plasma Processing Apparatus 1

As an example of plasma processing using the plasma processing apparatus 1 configured as described above, a case of etching a poly-Si film on the upper surface of the wafer W by using a processing gas containing HBr will be described.

As shown in FIG. 1, first, a wafer W is loaded into the processing chamber 2, mounted on the mounting table 3, and adsorbed onto the electrostatic chuck CK. A direct current and/or a high frequency voltage from the high frequency power supply HFQ via the matching unit MG is applied to the electrostatic chuck CK. The pressure control valve PCV is controlled by a controller CONT, and the processing chamber 2 is evacuated through the exhaust pipes 11, thereby reducing a pressure in the processing chamber 2. The controller CONT controls elements such as the control device 49 for controlling the flow rate, the high frequency power supply HFQ, the heater power source 4, and the microwave generator 35 in addition to the pressure control valve PCV. Further, the controller (labeled CONTROLLER in FIG. 1 and also abbreviated as CONT herein) outputs the instructions for flow rate control to the control device 49.

Then, the common gas consisting of Ar gas is supplied to the flow splitter 44 from the common gas source 41. The pressure of the Ar gas supplied to the flow splitter 44 is determined by the control device 49. At the same time, the additive gas containing HBr gas and $O_2$ gas is supplied to the common gas branch line 47 from the additive gas source 42. The partial pressures of the HBr gas and $O_2$ gas added to the common gas branch line 47 are controlled by the control device 49.

The flow splitter 44 divides the common gas consisting of Ar gas into two streams. The branching ratio of the flow splitter 44 is determined by the control device 49.

One of two streams of the common gas divided by the flow splitter 44 is introduced into the central inlets 58 of the ceiling portion of the processing chamber 2 via the common gas branch line 46. Then, it is introduced into the processing chamber 2 from the central inlets 58.

The other one of two streams of the common gas divided by the flow splitter 44 is introduced into the peripheral introduction portion 61 in the processing chamber 2 via the common gas branch line 47. The additive gas containing HBr gas and $O_2$ gas is added to the common gas branch line 47. Accordingly, the Ar gas, HBr gas and $O_2$ gas serving as a gaseous mixture of the common gas and the additive gas are supplied to the peripheral introduction portion 61. The gaseous mixture is supplied into the processing chamber 2 from the peripheral introduction portion 61.

When operating the microwave generator 35, first, the Ar gas is excited by the microwave to thereby generate an Ar plasma. Then, the HBr gas and $O_2$ gas are excited by the Ar plasma, and the poly-Si film is etched by the generated radicals and ions. After the etching process is performed for a predetermined period of time, the operation of the microwave generator 35 and the supply of the processing gas into the processing chamber 2 are stopped.

Then, the wafer W is unloaded from the processing chamber 2, and a series of steps of the plasma etching process are completed. When the plasma etching of the wafer W has been completed on a lot by lot basis, a cleaning gas such as $O_2$ gas is supplied into the processing chamber 2 from the common gas source 41, and the inside of the processing chamber 2 is cleaned.

Measures to Achieve the Optimum Dissociation State of Etching Gas

Etching of fine patterns needs to be performed according to etching species while protecting (depositing) the sidewalls of the film to be etched. Particularly, in the etching requiring a selection ratio, it is important to protect an etching mask by the deposition and perform etching while maintaining the balance of the etching. It is necessary to suppress the excessive dissociation of the etching gas and produce radical species and ion species required for etching by controlling the dissociation of the etching gas.

In the plasma processing apparatus 1 according to the present invention, since a plasma processing space is large, and the electron temperature of the plasma is attenuated with the distance from the dielectric window 16, it is possible to change the state of dissociation of the etching gas according to the position of introducing the etching gas. When introducing the etching gas immediately below the dielectric window 16, the dissociation of the etching gas is easier to proceed since the electron temperature of the plasma is high. On the other hand, when introducing the etching gas at a position relatively far from the dielectric window 16, the dissociation of the etching gas can be suppressed to a low level since the electron temperature of the plasma is low.

Therefore, when it is intended to obtain a desired dissociation state of the etching gas, it is possible to easily control the dissociation state by adjusting the amount of gas supplied immediately below the dielectric window 16, and the amount of gas supplied to a position away from the dielectric window 16. If the microwave plasma is generated by the radial line slot antenna as described above, it is possible to uniformly generate a plasma having a low electron temperature and high density (about $10^{12}$ cm$^{-3}$) in a region where the wafer W is processed.

That is, the plasma in a generation region immediately below the dielectric window 16 has a high density and a relatively high electron temperature, but the plasma is downwardly diffused into a region where the processing of the wafer W is performed, and the electron temperature also decreases. Since the plasma of the generation region has a high density, the high density of the plasma is sufficiently maintained even in the diffusion region.

From these, specifically, in order to generate the etching species and radicals while suppressing the excessive dissociation, a lot of etching gas can be supplied into the diffusion region of the microwave plasma. Since the peripheral introduction portion 61 is disposed in the diffusion region of the plasma in this embodiment, it is possible to suppress the dissociation by supplying the etching gas into the peripheral introduction portion 61. That is, it is possible to suppress the dissociation by supplying the Ar gas as the plasma excitation gas from the common gas source 41, and the HBr gas and $O_2$ gas as the etching gas from the additive gas source 42, during plasma processing.

Further, the peripheral inlets 62 are disposed to surround the flow of the processing gas injected toward the wafer W by the central inlets 58 disposed at the dielectric window 16, and configured to inject a processing gas toward the flow of the processing gas injected by the central inlets 58. Accordingly, the etching gas and the plasma reaching the surface of the wafer W can be independently controlled in the central portion of the wafer W and in the peripheral portion of the wafer W. Thus, it provides an excellent effect in the control of in-surface uniformity of the etching rate.

Further, the amounts of the gas supplied from the peripheral introduction portion 61 near the wafer W and the gas supplied from the central inlets 58 near the dielectric window 16 and the ratio thereof are determined depending on a combination of a target device and/or target film (e.g., polysilicon film, oxide film, nitride film or the like) on the wafer W and the selected etching gas. Accordingly, an optimum uniformity control becomes possible. The electron temperature of the microwave plasma is high in the vicinity of the dielectric window 16 of the generation region. However, if it is away from the generation region, the microwave plasma rapidly diffuses, and the electron temperature becomes lower. Thus, etching can be performed on the surface of the wafer W to be processed without damaging the wafer W.

The ring-shaped peripheral introduction portion 61 serves as a passage of diffusion of the plasma in the downward direction of the plasma. The central portion of the peripheral introduction portion 61 has a large opening, and the plasma moves downward toward the surface of the wafer W to be processed. The peripheral inlets 62 are provided in the peripheral introduction portion 61 in the direction perpendicular to the passage of diffusion of the plasma, and the HBr, $O_2$ and the like are injected as the etching gas from the peripheral inlets 62.

Since the electron temperature of the plasma is low, the etching gas supplied from the peripheral inlets 62 reaches the surface of the wafer W in a low dissociation state. For example, for the polysilicon film, even though the ion energy is low, ions are suitable to promote a chemical reaction in the etching, and, for example, cause a reaction to form a hole in the polysilicon film while maintaining verticality of the sidewall of the hole as an etching shape.

Further, by supplying the etching gas from the central inlets 58 facing the central portion of the wafer W as well as supplying the etching gas from the peripheral inlets 62 facing the peripheral portion of the wafer W, and selecting a ratio and supply amounts of both gases, uniformity of the etching rate in the surface of the wafer W can be controlled as desired.

By supplying the etching gas from the peripheral introduction portion 61, there are also advantages in terms of apparatus. That is, the etching gas such as HBr is a corrosive gas which corrodes aluminum. Since the block 57 of the central inlets 58 is made of aluminum, corrosion may occur even though the surface of the block 57 is coated with an anodic oxide film. Since the peripheral introduction portion 61 is made of a non-corrosive material such as quartz, there is no risk of corrosion even though the etching gas is allowed to flow in the peripheral introduction portion 61.

Additionally, when etching a silicon oxide film or the like, a CF-based or CHF-based gas (e.g., $CH_2F_2$ of deposition gas) is used as an etching gas. When a CF-based gas is introduced from the central inlets 58 provided to pass through the dielectric window 16, electrons and radicals generated by the plasma having a high electron temperature may flow reversely in the central inlets 58. Accordingly, the CF-based gas is dissociated before the gas is introduced into the processing chamber and the reaction products are deposited in the central inlets 58. This may lead to clogging of the central inlets 58. By introducing the CF-based gas into the processing chamber from the peripheral introduction portion 61 located at a position where the electron temperature of the plasma is low, it is possible to suppress the dissociation of the gas due to radicals and the like generated by the plasma having a high electron temperature and prevent the reaction products from being adhered to the central inlets 58.

Although the embodiment of the present invention has been described above, the present invention is not limited to the above embodiment, and it may be modified in various ways within a range that does not change the gist of the present invention.

For example, the substrate that is processed by the etching apparatus of the present invention may be any of a semiconductor wafer W, an organic EL substrate, a substrate for flat panel display (FPD).

If it is possible to introduce the microwave from the dielectric window 16 of the processing chamber 2 and generate a microwave excitation plasma in the processing chamber, a plasma source is not limited to the radial line slot antenna.

In the above-described embodiment, although the gas line 45 from the common gas source 41 is divided into the two common gas branch lines 46 and 47 through the flow splitter 44, and the additive gas line is connected to the common gas branch line 47 which is one of two streams divided by the flow splitter 44, the present invention is not limited thereto. For example, the gas line 45 from the common gas source 41 branches to the two common gas branch lines 46 and 47 of two streams without using the flow splitter 44, and the additive gas line may be connected to at least one of the common gas branch lines 46 and 47.

Test Examples

Figure 4:
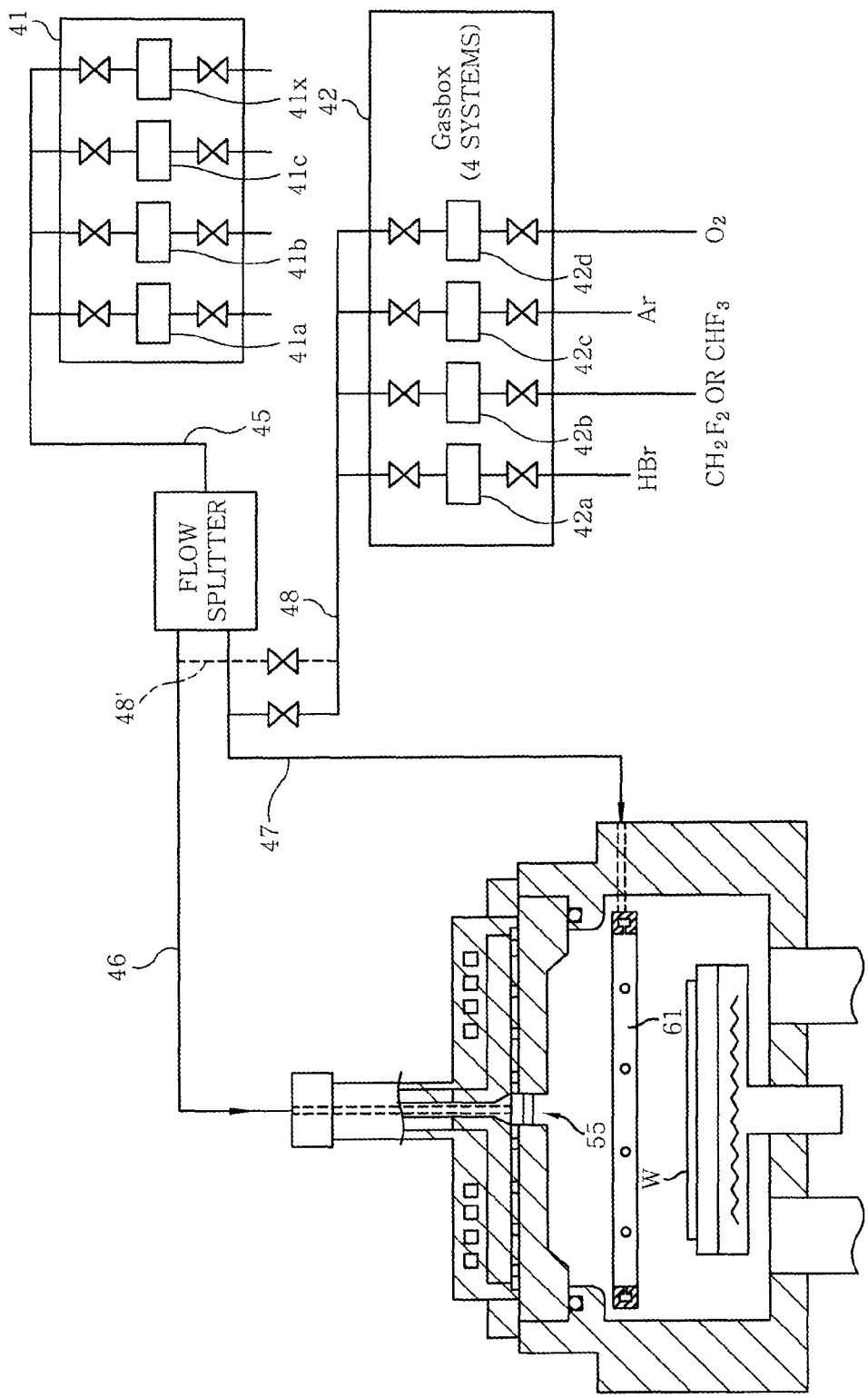
FIG. 4 is a vertical cross-sectional view of a plasma processing apparatus used in examples described herein.

As shown in FIG. 4, it was configured to supply a HBr gas, $CH_2F_2$ gas or $CHF_3$ gas, Ar gas and/or $O_2$ gas as an additive gas from the additive gas source 42. Further, in FIG. 4, for clarity of illustration, the description of the detailed structure of the electrostatic chuck and the like shown in FIG. 1 is omitted. Flow control valves 42a to 42d are provided as a flow control unit for adjusting the flow rate of each gas in a gas box. The flow rate of each gas is controlled by each of the flow control valves 42a to 42d. Each of the flow control valves 42a to 42d is controlled by the control device 49 shown in FIG. 1.

Also in the common gas source 41, a plurality of flow control valves 41a, 41b, 41c, . . . 41x are provided as a flow control unit for individually adjusting the flow rate of a plurality of different types of gas species, and they are controlled by the control device 49 shown in FIG. 1. It was configured to supply any of a HBr gas, $CH_2F_2$ gas or $CHF_3$ gas, Ar gas, $O_2$ gas, a cleaning gas and other common gases as a common gas from the common gas source 41. Gas species are selected according to the kind of film to be etched. For example, when etching a poly-Si film, the Ar gas, HBr gas, and $O_2$ gas are selected, and when etching a $SiO_2$ film, the Ar gas, CHF-based gas and $O_2$ gas are selected. It was configured such that the common gas is divided into two streams by the flow splitter 44, one stream of processing gas is introduced into the processing chamber 2 from the central inlets 58 of the ceiling portion of the processing chamber 2, and the other stream of processing gas is introduced from the peripheral introduction portion 61 of the processing chamber 2.

Test Example 1 of Etching of Poly-Si

Using the Ar gas as the common gas, and $HBr/O_2$ as the additive gas, the poly-Si film on the wafer W was etched. Only the Ar gas was allowed to flow in the common gas line 45. The Ar gas was divided into two streams by the flow splitter 44, and the Ar gas was introduced into the processing chamber 2 from the central inlets 58 and the peripheral introduction portion 61. A ratio of the introduction amounts of the Ar gas (hereinafter referred to as RDC) is shown in Table 1 below.

In Table 1, RDC is represented by a ratio of the gas introduction amount from the central inlets 58 to the gas introduction amount from the peripheral introduction portion 61. In Test Example 1, RDC was changed to three patterns of (1) 7:93, (2) 50:50, and (3) 80:20. For each pattern of RDC, HBr and $O_2$ were added to one of the common gas branch lines. In this case, MW represents the power of the microwave, RF represents the bias power applied to the wafer, and Pressure represents the pressure in the processing chamber 2.

TABLE 1

| Common gas | | | | Additive gas | | | | |
|---|---|---|---|---|---|---|---|---|
| Ar | RDC (1) | RDC (2) | RDC (3) | HBr | $O_2$ | MW | RF | Pressure |
| 1000 sccm | 7:93 | 50:50 | 80:20 | 580 sccm | 3 sccm | 2000 W | 150 W | 100 mT |

Comparative Example 1 of Etching Poly-Si

Comparative Example 1 was carried out without addition of processing gas from the additive gas source 42. Without addition of HBr and $O_2$ from the additive gas source 42, Ar/HBr/$O_2$ was supplied from only the common gas source 41. In Comparative Example 1, RDC was changed to two patterns of (1) 7:93 and (2) 50:50. Table 2 shows the processing conditions of Comparative Example 1.

TABLE 2

| Common gas | | | RDC (1) | RDC (2) | MW | RF | Pressure |
|---|---|---|---|---|---|---|---|
| Ar | HBr | $O_2$ | | | | | |
| 1000 sccm | 580 sccm | 3 sccm | 7:93 | 50:50 | 2000 W | 150 W | 100 mT |

Figure 5A:
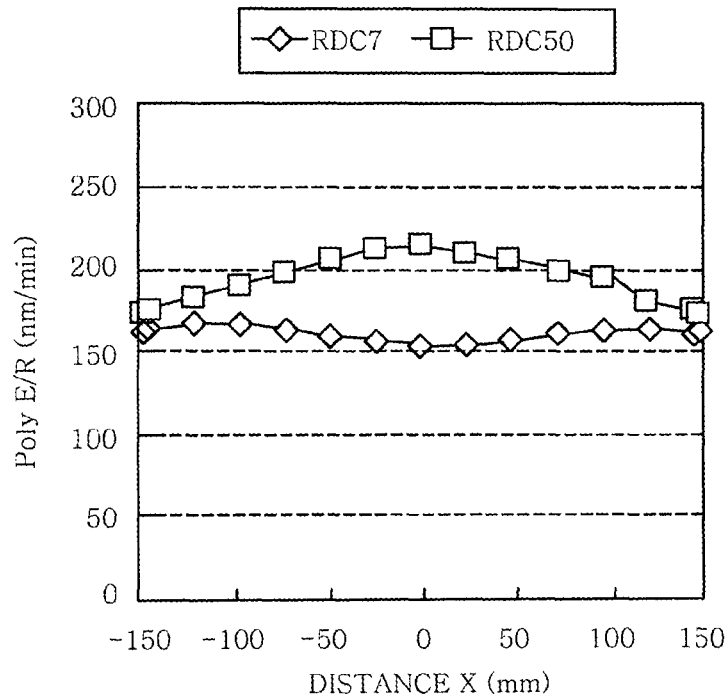
FIGS. 5A and 5B show graphs obtained by evaluating the etching rates in the X-X direction of the wafer in Comparative Example 1 and Test Example 1.
Figure 5B:
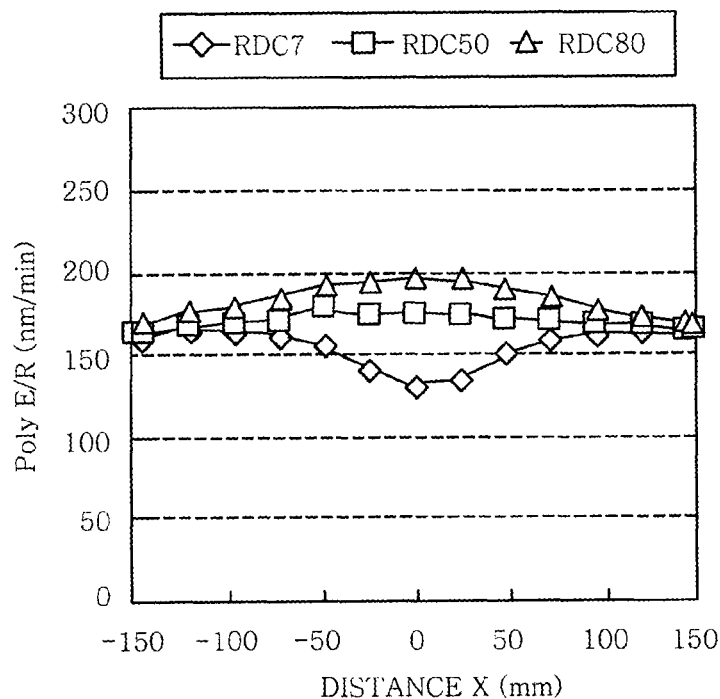

FIGS. 5A and 5B are graphs showing the etching rates in the X-X direction of the wafer W in Test Example 1 and Comparative Example 1. In FIGS. 5A and 5B, a vertical axis represents the etching rate (Poly E/R (nm/min)) and a horizontal axis represents the distance X (mm) from the center of the wafer W. As the line in the graph is closer to a flat straight line, the in-surface uniformity of the etching rate becomes higher.

In Comparative Example 1, when the RDC is 50 (in the case where the gas introduction amount from the central inlets (center) is 50%, and the gas introduction amount from the peripheral inlets (edge) is 50%), the etching rate of the peripheral portion of the wafer W was lower than the etching rate of the central portion of the wafer W, and it was difficult to ensure uniformity. Further, when the RDC is set to 7:93 (when the amount of gas introduced to the central portion of the wafer W is 7%), the etching rate of the central portion of the wafer W was lowered.

On the other hand, by changing the RDC in Test Example 1, it is possible to variously change the distribution of uniformity of the etching rate between where the central portion is recessed and where the central portion is swelled. It is estimated that this is because it is possible to make the peripheral portion of the wafer W more easily etched than the central portion of the wafer W by supplying HBr and $O_2$ to the peripheral portion of the wafer W. For example, when the RDC is set to 7:93, it is possible to reduce the etching rate of the central portion of the wafer W. When the RDC is set to 50:50, it is possible to make the distribution of the etching rate flat. Particularly, compared with the comparative example in RDC7, it is possible to greatly change the etching rate of the central portion.

Figure 6:
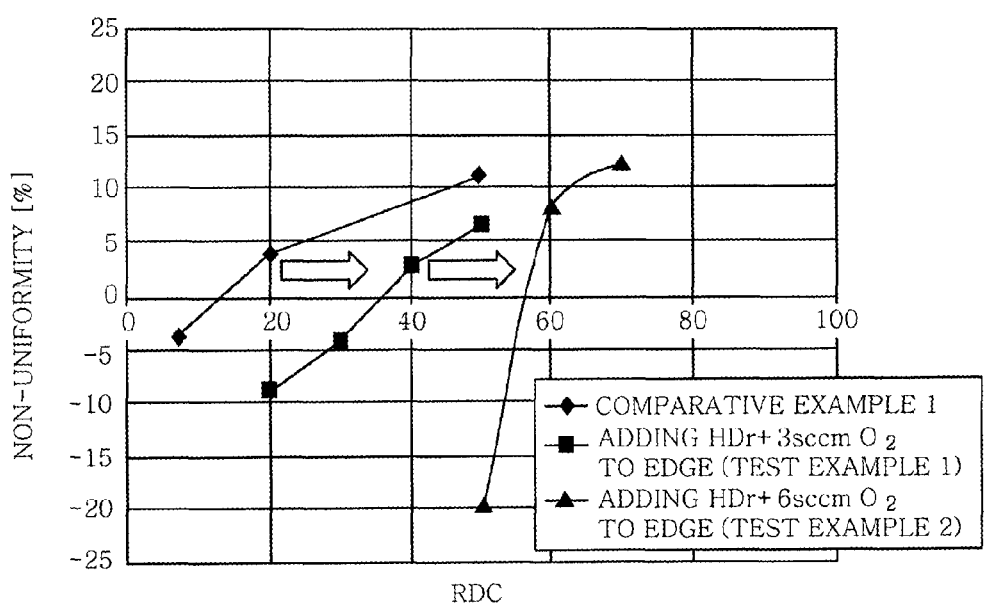
FIG. 6 is a graph obtained by evaluating the uniformity in Comparative Example 1 and Test Examples 1 and 2.

FIG. 6 is a graph obtained by evaluating the uniformity in Comparative Example 1, and Test Examples 1 and 2. A horizontal axis represents a value of the RDC (ratio of the amounts of gases introduced into the central portion of the wafer W), and a vertical axis represents non-uniformity. As the positive value of the vertical axis is larger, it means that there is a tendency that the etching rate in the central portion of the wafer W becomes higher. As the negative value of the vertical axis is smaller (the absolute value of the vertical axis is larger), it means that there is a tendency that the etching rate in the peripheral portion of the wafer W becomes higher.

In case of Comparative Example 1, when the RDC is 12 to 13, the non-uniformity (vertical axis) becomes zero (the most uniform in other words). However, when the RDC exceeds 12 to 13, the non-uniformity becomes a positive value (i.e., the etching rate of the central portion becomes larger compared to the peripheral portion of the wafer W). On the other hand, in case of Test Example 1 in which hydrogen bromide and 3 sccm of oxygen are introduced from the edge, when the RDC is 35 to 36, the non-uniformity of the vertical axis becomes zero (the most uniform in other words). When the non-uniformity is zero, the value of the RDC is greater than that of Comparative Example 1. As the value of the RDC increases to approach 50, the non-uniformity increases. In addition, if the amount of oxygen to be introduced is increased and set to 6 sccm (i.e., in case of Test Example 2), the value of the RDC at which the uniformity becomes better is about 55.

From the above, when hydrogen bromide (HBr) and oxygen gas serving as additive gases are separately added and introduced from the edge, the RDC value at which the uniformity is obtained can be moved to a larger value than that in the case of mixing all argon, oxygen (3 sccm) and hydrogen bromide (HBr, 580 sccm) and then changing the value of RDC. Particularly, when increasing the amount of oxygen, the RDC value at which the best uniformity is obtained moves to the right direction. It can be found that the flow rate ratio of oxygen has a significant effect on the processing. Also, it can be seen that since the value of the non-uniformity is distributed in the positive and negative directions with balance with respect to changes in the RDC, it is possible to make the peripheral portion of the wafer W more largely etched than in Comparative Example 1.

Test Example 2 in FIG. 6 shows the data obtained when the amount of $O_2$ added is twice that of Test Example 1. If the amount of $O_2$ added is doubled, it is possible to further increase the RDC when the non-uniformity becomes zero. However, it should be noted that the rate of change of the non-uniformity is steep with respect to changes in the RDC. That is, when comparing the case of adding oxygen of 3 sccm in Test Example 1 and the case of adding oxygen of 6 sccm in Test Example 2, the amount of change in non-uniformity (%) with respect to the amount of change in the RDC (i.e., slope) is different. It can be seen that the change in the RDC more sensitively affects the non-uniformity in the case of adding oxygen of 6 sccm.

In other words, when adding oxygen of 6 sccm, RDC values in which the uniformity is obtained are in a very narrow range. On the other hand, when adding oxygen of 3 sccm, the range of RDC values in which the uniformity is obtained is wide, and can be said to be more robust, i.e., the change in the RDC less sensitively affects the non-uniformity. It can be considered that the change occurring in the RDC in this way even if the flow rate of the total etching gas introduced into the processing chamber is equal is due to a difference in dissociation state of the gas supplied into the processing apparatus.

When an etching process is continuously performed on a large number of wafers, the state of the processing chamber changes over time, for example, as etching deposits are deposited in the processing chamber 2, which causes a variation between the wafers in the etching process. The present invention is also effectively used to suppress the non-uniformity of the processing of the wafer due to changes over time. Specifically, by inspecting the uniformity of the etching of the wafer every a predetermined number of wafers, it is possible to make adjustment of the uniformity easier by changing the composition of the etching gas, or feeding back the RDC value to an optimal value.

With respect to the wafer after the etching process, an etching shape (etching depth, etc.) is inspected, e.g., every 25 sheets by using an optical technique, the in-surface etching uniformity is calculated, and it is determined whether its value is a reference value (within a reference range). If the value is not the reference value (within the reference range), the value of the RDC is finely adjusted. More specifically, it can be adjusted such that the RDC value is decreased if the non-uniformity (%) is positive, and the RDC value is increased if the non-uniformity (%) is negative. In FIG. 6, the range in which the RDC value can be changed is larger in the case of Test Examples according to the embodiment than in the case of Comparative Example 1, and it can be said that so-called "adjustment range" is large and the controllability is high.

Furthermore, the data for each amount of oxygen as shown in FIG. 6 may be stored in the controller CONT including a storage device. Accordingly, by adjusting the flow rate through each flow control valve, it is possible to automatically perform feedback control such that the RDC value is controlled as described above.

As shown in FIG. 6, the amount of gas supplied from the peripheral inlets 62 to the peripheral portion of the wafer W at a position closer to the wafer W can be relatively increased as compared to that of the gas supplied from the central inlets 58 to the central portion of the wafer W. Accordingly, the uniformity of the etching rate over the entire surface of the wafer W can be more largely changed than that when the supply amounts of both gases are changed in a same ratio.

Test Example 3 of Etching of Poly-Si

In Test Example 1, as shown in FIG. 4, HBr and O$_2$ were added to the common gas branch line 47 connected to the peripheral introduction portion 61. On the contrary, an additive gas was added to the common gas branch line 46 connected to the central inlets 58 in Test Example 3. That is, instead of the additive gas line 48 in FIG. 4, an additive gas line 48' (shown by a dotted line in FIG. 4) was provided, and connected to the common gas branch line 46.

Ar/HBr/O$_2$ were used as common gases flowing in the common gas line 45, and O$_2$ was used as an additive gas flowing in the additive gas line 48'. The processing conditions are shown in Table 3.

TABLE 3

| Common gas | | | | Additive | | | |
|---|---|---|---|---|---|---|---|
| Ar | HBr | O$_2$ | RDC | gas O$_2$ | MW | RF | Pressure |
| 1000 sccm | 600 sccm | 3 sccm | 7:93 | 3 sccm | 2000 W | 150 W | 100 mT |

Figure 7:
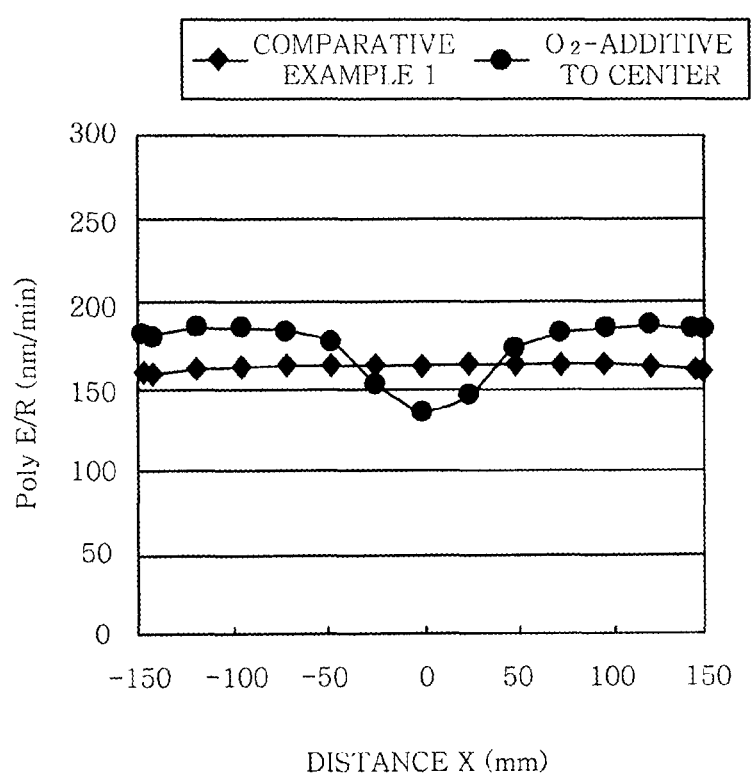
FIG. 7 is a graph obtained by evaluating the etching rates in the X-X direction of the wafer in Comparative Example 1 and Test Example 3.

FIG. 7 is a graph showing the etching rate along the X-X direction of the wafer W in Test Example 3 in which O$_2$ was added, and the etching rate in Comparative Example 1 in which the RDC was set to 7:93. In FIG. 7, a vertical axis represents the etching rate (Poly E/R (nm/min)) and a horizontal axis represents the distance X (mm) from the center of the wafer W. As in Test Example 3, it can be seen that when the O$_2$ gas is added from the central inlets 58, the etching rate of the central portion of the wafer W is reduced locally compared with the case of adding the O$_2$ gas from the peripheral introduction portion 61. It is considered that, in order to uniformly control the distribution of the etching rate in a wide range, it is effective to add the etching gas from the peripheral introduction portion 61 as in Test Example 1. The etching rate of Test Example 3 exhibited the similar behavior to that of Test Example 1 in which the RDC is 7.

Further, as a configuration of the apparatus, the additive gas lines 48 and 48' may be provided to supply the additive gas from both.

Test Example 4 of Etching for Forming Shallow Trench Isolation (STI)

In Test Example 4, silicon etching for forming STI was performed on a silicon substrate serving as an etching target under the conditions (e.g., a gas flow rate ratio) shown in Table 4 below by using the same apparatus configuration as in Test Example 1. Etching was carried out on a sample having a dense portion where the pattern is densely formed and an isolated portion where the pattern is loosely formed in each of the central portion and the peripheral portion of the wafer W.

TABLE 4

| Common gas | | | Additive gas O$_2$ | | | | |
|---|---|---|---|---|---|---|---|
| Ar | HBr | RDC | HBr | O$_2$ | MW | RF | Pressure |
| 1000 sccm | 250 sccm | 40:60 | 750 sccm | 3 sccm | 2000 W | 150 W | 100 mT |

Figure 8:
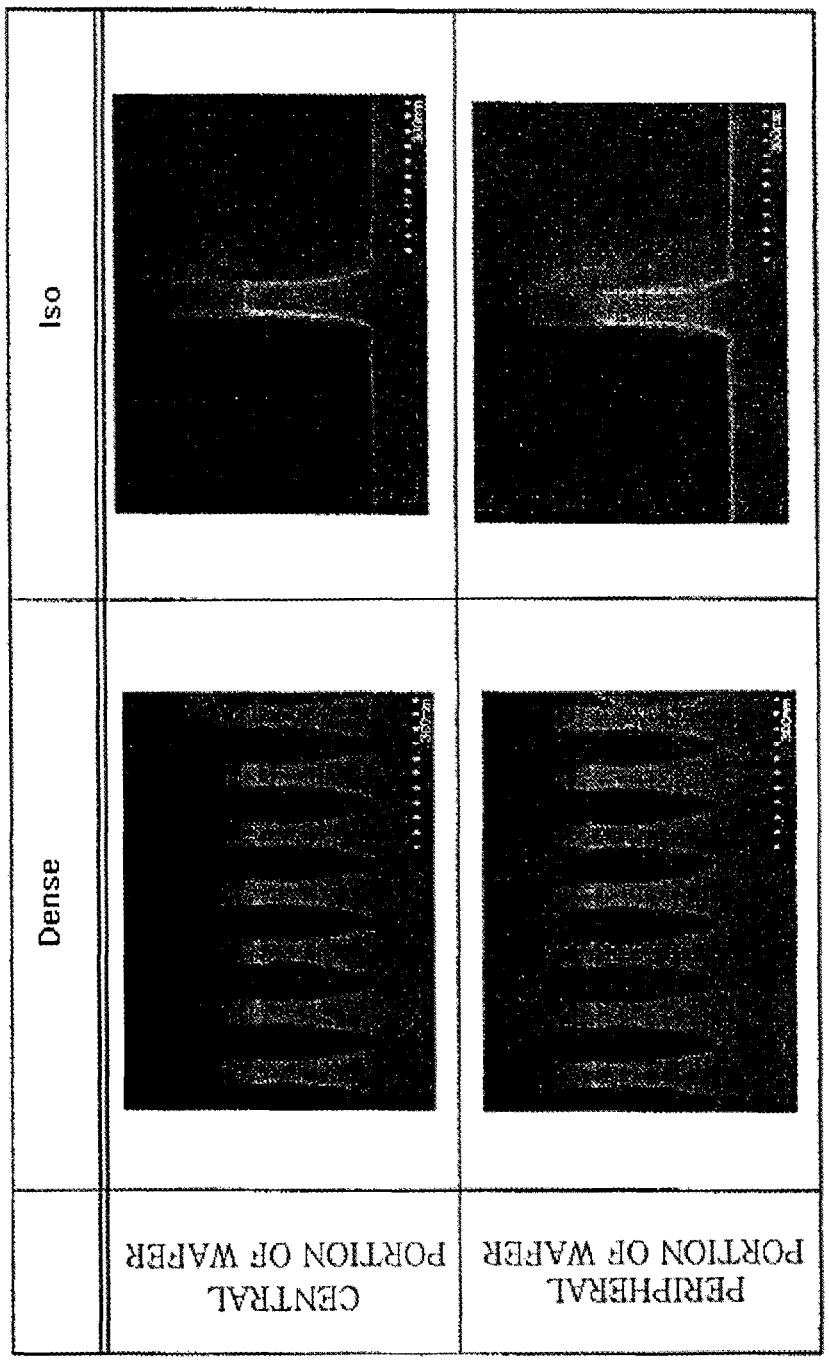
FIG. 8 is a diagram showing a cross-sectional photograph of the pattern formed on the silicon substrate.

FIG. 8 is a diagram showing a cross-sectional photograph of the pattern formed on the silicon substrate, wherein the dense portion is represented by Dense, and the isolated portion is represented by Iso. As a result of measuring a line width of the pattern, a tilt angle of a sidewall and a depth of the trench, a difference between the central portion and the peripheral portion of the wafer W falls in a required range, and a difference even between the dense and sparse pattern portions falls in the required range.

Further, the RDC value can be appropriately adjusted taking into account the etching selectivity between a film to be etched and an underlying film. For example, when the underlying film is an oxide film and etching is performed by using oxygen containing plasma, it is possible to widen the range of the RDC value required for etching with high uniformity since etching can be performed with high shape controllability and high etching selectivity between the film to be etched and the underlying film.

As described above, the plasma processing apparatus includes the processing chamber 2, the dielectric window 16 which is provided at the top of the processing chamber 2 and defines a processing space, the mounting table 3 provided inside the processing chamber 2, the slot antenna 20 provided on the upper surface of the dielectric window 16, the microwave introduction path 36, 37 and 30 connected to the microwave generator 35 and the slot antenna 20, the exhaust device 10 communicating with the inside of the processing chamber 2, the common gas line 45 connected to the common gas source 41 containing a plasma excitation gas such as rare gas, the flow splitter 44 which is provided in the common gas line 45 to divide the common gas line 45 into the first and second common gas branch lines 46 and 47, and can adjust a ratio of the flow rates of gases flowing through the first and second common gas branch lines 46 and 47, the central introduction portion 55 which is connected to the first common gas branch line 46 and has the central inlets 58 located above the central portion of the wafer W mounted on the mounting table 3, the peripheral introduction portion 61 which is connected to the second common gas branch line 47 and has the peripheral inlets 62 arranged along the circumferential direction of the space above the wafer W and located below the dielectric window 16, and the additive gas line connected to the additive gas source 42 containing an etching gas and at least one of the first and second common gas branch lines 46 and 47. According to this apparatus, it is possible to control the in-surface uniformity of the substrate processing while controlling the dissociation state of processing gas in various levels.

What is claimed is:

1. A plasma processing method which includes introducing a processing gas into a processing chamber which has a dielectric window provided at a ceiling portion of the processing chamber, the dielectric window transmitting therethrough a microwave for generating a plasma, and wherein an inside of the processing chamber is capable of being maintained airtightly; exhausting the processing gas introduced into the processing chamber through an exhaust port provided below an upper surface of a substrate mounted on a mounting table; and introducing a microwave into a processing space of the processing chamber through slots of a slot antenna provided on an upper surface of the dielectric window of the processing chamber, the method comprising:

dividing a common gas supplied from a common gas source into two common gas streams;

introducing the common gas divided into two common gas streams to a central introduction portion having a central inlet which supplies the common gas to a central portion of the substrate mounted on the mounting table, and to a peripheral introduction portion having peripheral inlets which supplies the common gas to a peripheral portion of the substrate mounted on the mounting table, the peripheral inlets being arranged about a circumferential region at a location above the substrate; and adding an additive gas supplied from an additive gas source to at least one of the two common gas streams, wherein the central inlet is disposed at a central portion of the dielectric window of the processing chamber, wherein the peripheral inlets are disposed above the substrate mounted on the mounting table and below the dielectric window of the processing chamber, and wherein an electron temperature of a plasma in a region where the peripheral inlets are disposed is lower than that in a region where the central inlet is disposed.

2. The plasma processing method of claim 1, wherein the common gas supplied from a common gas source is divided into the two common gas streams by a flow splitter.

* * * * *